United States Patent [19]

Yamazaki

[11] Patent Number: 4,464,415

[45] Date of Patent: Aug. 7, 1984

[54] PHOTOELECTRIC CONVERSION SEMICONDUCTOR MANUFACTURING METHOD

[76] Inventor: Shunpei Yamazaki, 21-21 Kitakarasuyama 7-chome, Setagaya-ku, Tokyo, Japan

[21] Appl. No.: 353,335

[22] Filed: Mar. 1, 1982

Related U.S. Application Data

[62] Division of Ser. No. 237,609, Feb. 24, 1981, Pat. No. 4,409,134.

[30] Foreign Application Priority Data

Mar. 3, 1980 [JP] Japan .................................. 55-26388

[51] Int. Cl.³ ............................................. G03G 5/082
[52] U.S. Cl. ........................................ 427/39; 427/38; 427/74
[58] Field of Search .............................. 427/38, 39, 74

[56] References Cited

U.S. PATENT DOCUMENTS 4,265,991  5/1981  Hirai et al. .............................. 430/64

Primary Examiner—James R. Hoffman
Attorney, Agent, or Firm—Gerald J. Ferguson, Jr.; Joseph J. Baker

[57] ABSTRACT

A semi-amorphous, photoelectric conversion semiconductor manufacturing method in which substrates are disposed in a reaction chamber having a gas inlet and a gas outlet and a gas mixture containing at least a semiconductor material gas which includes a dangling bond neutralizer and a carrier gas is introduced into the reaction chamber. An electromagnetic field is applied to the gas mixture to ionize it into a gas mixture plasma in the reaction chamber. The plasma is passed to the substrates where the semiconductor material doped with the neutralizer is deposited on each substrate. The semiconductor material deposited on each substrate becomes a semi-amorphous, photoelectric conversion semiconductor by holding the atmospheric pressure in the reaction chamber below 1 atm and maintaining the substrate at a temperature lower than the temperature at which the semiconductor material on the substrate becomes crystallized.

8 Claims, 3 Drawing Figures

PHOTOELECTRIC CONVERSION SEMICONDUCTOR MANUFACTURING METHOD

This is a division of applicaton Ser. No. 237,609, filed 2/24/81, now U.S. Pat. No. 4,409,134.

BACKGROUND OF THE INVENTION

1. Field of the Invention

The present invention relates to a novel semiconductor for photoelectric conversion use which has excellent optical and electrical properties of both a crystalline semiconductor, in particular, a single crystal semiconductor and a noncrystalline semiconductor, in particular, an amorphous semiconductor, and further, the invention pertains to a manufacturing method of such a photoelectric conversion semiconductor.

2. Description of the Prior Art

Heretofore, there have been proposed photoelectric conversion semiconductors which are formed of a single crystal semiconductor, a polycrystalline semiconductor and a non-crystalline semiconductor, respectively.

The single crystal, photoelectric conversion semiconductor usually exhibits a high degree of photo-conductivity as compared with the polycrystalline and non-crystalline photoelectric conversion semiconductors each of which is doped with a dangling bond neutralizer. For example, in the case where the polycrystalline, photoelectric conversion semiconductor is formed of polycrystalline silicon, its photoconductivity is $10^{-5}$ to $10^{-8}$ S·cm$^{-1}$ under AM1 (100 mW/cm$^2$) illumination of the sunlight (The same shall apply hereinafter.) and its dark-conductivity is only $10^{-7}$ to $10^{-12}$ S]cm$^{-1}$. The non-crystalline photoelectric conversion semiconductor which is formed of amorphous silicon has a photoconductivity as low as $10^{-6}$ to $10^{-8}$ S·cm$^{-8}$ and a dark-conductivity as low as $10^{-8}$ to $10^{-12}$ S·cm$^{-1}$. In contrast thereto, a photoelectric conversion semiconductor formed of single crystal silicon has a photoconductivity of $10^{-3}$ S·cm$^{-1}$ or more and a darkconductivity of $10^4$ to $10^{31\ 6}$ S·cm$^{-1}$.

Accordingly, it can be said that the single crystal, photoelectric conversion semiconductor is excellent in terms of photoconductivity and dark-conductivity as compared with the polycrystalline and non-crystalline photoelectric conversion semiconductors.

In general, the single crystal, photoelectric conversion semiconductor has a large diffusion length of minority carriers than the polycrystalline and non-crystalline photoelectric conversion semiconductors each of which is doped with the dangling bond neutralizer. For instance, in the case of the non-crystalline, photoelectric conversion semiconductor being formed of amorphous silicon, its diffusion length of minority carriers is only 300 to 400 Å and also in the case of the polycrystalline, photoelectric conversion semiconductor being formed of polycrystalline silicon, its diffusion length of minority carriers is substantially equal to that of the amorphous silicon. In contrast thereto, in the case of the single crystal, photoelectric conversion semiconductor being formed of single crystal silicon, its diffusion length of minority carriers ranges from $10^2$ to $10^4$ μm.

Accordingly, it can be said that the single crystal photoelectric conversion semiconductor excels the polycrystalline and non-crystalline photoelectric conversion semiconductors in the diffusion length of minority carriers.

Furthermore, the single crsytal, photoelectric conversion semiconductor usually has a higher impurity ionization rate than the polycrystalline and non-crystalline photoelectric conversion semiconductors. The impurity ionization rate herein mentioned is a rate in which ions providing the P or N type conductivity are generated in the semiconductor when it has been doped with a P or N type impurity. For example, the non-crystalline, photoelectric conversion semiconductor which is formed of amorphous silicon has an impurity ionization rate of approximately 0.1%. In the case of the polycrystalline, photoelectric conversion semiconductor, even if it is doped with a P or N type impurity, the impurity is precipitated on the grain boundary and, consequently, ions which provide the P or N type conductivity are difficult to generate in the semiconductor. In contrast thereto, the single crystal, photoelectric conversion semiconductor which is formed of single crystal silicon has an impurity ionization rate close to 100%.

Accordingly, it can be said that the single crystal, photoelectric conversion semiconductor is excellent in terms of impurity ionization rate as compared with the polycrystalline and non-crystalline photoelectric conversion semiconductors.

In general, however, the single crystal photoelectric conversion semiconductor has a smaller optical absorption coefficient than the non-crystalline, photoelectric conversion semiconductor as is the case with the polycrystalline photoelectric conversion semiconductor. For instance, the non-crystalline photoelectric conversion semiconductor which is formed of amorphous silicon exhibits optical absorption coefficients of $4 \times 10^5$ cm$^{-1}$, $1 \times 10^5$ cm$^{-1}$ and $2 \times 10^4$ cm$^{-1}$ for lights having wavelengths of 0.4, 0.5 and 0.6 μm, respectively. In contrast thereto, the single crystal, photoelectric conversion semiconductor which is formed of a single crystal silicon has optical absorption coefficients of $1 \times 10^5$ cm$^{-1}$, $1 \times 10^4$ cm$^{-1}$ and $6 \times 10^3$ cm$^{-1}$ for the lights of the 0.4, 0.5 and 0.6 μm wavelengths, as is the case with the polycrystalline, photoelectric conversion semiconductor.

Accordingly, it cannot be said that the single crystal, photoelectric conversion semiconductor excels the non-crystalline, photoelectric conversion semiconductor in optical absorption coefficient.

Moreover, the single crystal, photoelectric conversion semiconductor usually has a smaller energy band gap than the non-crystalline, photoelectric conversion semiconductor doped with the dangling bond neutralizer, as is the case with the polycrystalline, photoelectric conversion semiconductor similarly doped with the neutralizer. For example, in the case where the non-crystalline, photoelectric conversion semiconductor is formed of amorphous silicon, its energy band gap is in the range of 1.7 to 1.9 eV. In contrast thereto, the single crystal, photoelectric conversion semiconductor which is formed of single crystal silicon has an energy band gap of 1.1 eV as in the case where the abovesaid polycrystalline, photoelectric conversion semiconductor is formed of polycrystalline silicon.

Furthermore, in the single crystal, photoelectric converson semiconductor, transition of electrons is indirect even at low temperatures.

In general, the non-crystalline, photoelectric conversion semiconductor, in particular, an amorphous, photoelectric conversion semiconductor has a larger optical absorption coefficient than the single crystal and polycrystalline photoelectric conversion semiconductors. For instance, in the case where the non-crystalline, photoelectric conversion semiconductor is formed of amorphous silicon, it exhibits optical absorption coefficients of $4 \times 10^5$ cm$^{-1}$, $1 \times 10^5$ cm$^{-1}$ and $2 \times 10^4$ cm$^{-1}$ for the lights of 0.4, 0.5 and 0.6 μm wavelengths, as described previously; namely, the non-crystalline, photoelectric conversion semiconductor is far larger in the optical absorption coefficient than the single crystal, photoelectric conversion semiconductor which is formed of single crystal silicon.

Accordingly, it can be said that the non-crystalline, especially, amorphous photoelectric conversion semiconductor is excellent in optical absorption coefficient, as compared with the single crystal and polycrystalline photoelectric conversion semiconductors.

Besides, in the case where the non-crystalline, in particular, amorphous, photoelectric conversion semiconductor is doped with the dangling bond neutralizer, it has a larger energy band gap than the single crystal, photoelectric conversion semiconductor and the polycrystalline one doped with the dangling bond neutralizer. For example, above non-crystalline, photoelectric conversion semiconductor which is formed of amorphous silicon has an energy band gap ranging from 1.7 to 1.9 eV. This energy band gap is larger than the energy band gaps of the single crystal, photoelectric conversion semiconductor formed of single crystal silicon and the polycrystalline, photoelectric conversion semiconductor formed of polycrystalline silicon and doped with the dangling bond neutralizer.

Further, in the non-crystalline, especially, amorphous photoelectric conversion semiconductor, the transition of electrons is direct at low temperatures.

As will be appreciated from the above, the single crystal, photoelectric conversion semiconductor is excellent in terms of the photoconductivity, diffusion length of minority carriers and impurity ionization rate but poor in the optical absorption coefficient; therefore, this semiconductor is not suitable for use as a light-receiving, photoelectric conversion semiconductor. Further, the single crystal, photoelectric conversion semiconductor cannot be employed as a light-emitting, photoelectric conversion semiconductor because the transistor of electrons is indirect.

The non-crystalline photoelectric conversion semiconductor, especially, the amorphous one, is excellent in the optical absorption coefficient but poor in the photoconductivity, the diffusion length of minority carriers and the impurity ionization rate; accordingly, this semiconductor is not suitable for use as a light-receiving, photoelectric conversion semiconductor. In addition, since the non-crystalline or amorphous, photoelectric conversion semiconductor permits direct transition of electrons, it is considered that this semiconductor can be used as a light-emitting, photoelectric conversion semiconductor, but it cannot be employed because of its low dark-conductivity and impurity ionization rate.

Moreover, the polycrystalline, photoelectric conversion semiconductor is not suitable at all for use as a light-receiving and a light-emitting photoelectric conversion semiconductor.

SUMMARY OF THE INVENTION

Accordingly, it is an object of the present invention to provide a novel photoelectric conversion semiconductor which has excellent optical and electrical properties of both a crystalline semiconductor, in particular, a single crystal one and a non-crystalline semiconductor, in particular, an amorphous one.

Another object of the present invention is to provide a method for the manufacture of the above photoelectric conversion semiconductor.

The photoelectric conversion semiconductor of the present invention is characterized in that it is formed of a mixture of a microcrystalline semiconductor and a non-crystalline semiconductor, that the mixture is doped with a dangling bond neutralizer, and that the microcrystalline semiconductor has a lattice strain.

The present inventor names the photoelectric conversion semiconductor of the present invention as a semiamorphous photoelectric conversion semiconductor.

With such a semi-amorphous, photoelectric conversion semiconductor of the present invention, the presence of the microcrystalline semiconductor and the dangling bond neutralizer provides a high degree of photoconductivity, a high degree of dark-conductivity and a large diffusion length of minority carriers as compared with those of the non-crystalline, photoelectric conversion semiconductor, as is the case with the single crystal, photoelectric conversion semiconductor.

Since the photoelectric conversion semiconductor of the present invention contains the microcrystalline semiconductor, it has a higher impurity ionization rate than the non-crystalline, photoelectric conversion semiconductor as is the case with the single crystal one.

Further, according to the photoelectric conversion semiconductor of the present invention, the presence of the non-crystalline semiconductor and the lattice strain of the microcrystalline semiconductor provides a larger optical absorption coefficient than that of the single crystal, photoelectric conversion semiconductor, as in the case of the non-crystalline, particularly, amorphous photoelectric conversion semiconductor.

Moreover, the photoelectric conversion semiconductor of the present invention has an energy band gap intermediate between those of the single crystal photoelectric conversion semiconductor and the non-crystalline one because of the presence of the microcrystalline semiconductor, the non-crystalline semiconductor and the lattice strain of the microcrystalline semiconductor.

In the photoelectric conversion semiconductor of the present invention, the transition of electrons is direct because of the presence of the microcrystalline semiconductor, the non-crystalline semiconductor and the lattice strain of the microcrystalline semiconductor.

Thus, the photoelectric conversion semiconductor of the present invention has, in combination, excellent optical and electrical properties of the single crystal, photoelectric conversion semiconductor and the non-crystalline, photoelectric conversion semiconductor, particularly, the amorphous one.

Accordingly, the photoelectric conversion semiconductor of the present invention has the advantage that it can be employed not only as a light-receiving, photoelectric conversion semiconductor but also as a light-emitting one.

DESCRIPTION OF THE PREFERRED EMBODIMENTS

The semi-amorphous, photoelectric conversion semiconductor of the present invention is formed of a mixture of a microcrystalline semiconductor and a noncrystalline semiconductor and the mixture is doped with a dangling bond neutralizer and the microcrystalline semiconductor has a lattice strain.

According to an embodiment of the present invention, the microcrystalline semiconductor and the noncrystalline semiconductor are both, for example, silicon; in this case, the mixture is normally silicon and the microcrystalline semiconductor is dispersed in the noncrystalline semiconductor. The dangling bond neutralizer is composed of hydrogen or halogen such as fluoride or chlorine and the mixture is doped with such a dangling bond neutralizer in an amount of less than 5 mol % relative to the former. The microcrystalline semiconductor is 5 to 200Å in particle size and has an appropriate lattice strain.

The abovesaid mixture contains an impurity which imparts P or N type conductivity to the mixture. In this case, the impurity is contained in the microcrystalline semiconductor.

In the case of the abovesaid embodiment, the photoelectric conversion semiconductor has a dark conductivity of $1 \times 10^{-4}$ to $1 \times 10^{-6}$ S·cm$^{-1}$ and a photoconductivity higher than $1 \times 10^{-3}$ S·cm$^{-1}$ under AM1 illumination. According to my experiments, one of samples had a dark conductivity of $6.7 \times 10^{-5}$ S·cm$^{-1}$ and a photoconductivity of $2.8 \times 10^{-3}$ S·cm$^{-1}$; another sample had a dark conductivity of $3.3 \times 10^{-4}$ S·cm$^{-1}$ and a photoconductivity of $1.4 \times 10^{-3}$ S·cm$^{-1}$; and still another sample had a dark conductivity of $8.0 \times 10^{-4}$ S·cm$^{-1}$ and a photoconductivity of $2.7 \times 10^{-3}$ S·cm$^{-1}$.

The semi-amorphous, photoelectric conversion semiconductor of the above embodiment has a diffusion length of minority carriers ranging from 0.5 to 100 μm. In one of the samples obtained by my experiments, the diffusion length of minority carriers was 10.5 μm.

Further, the above photoelectric conversion semiconductor has an impurity ionization rate higher than 99%. One of the samples experimentally produced had an impurity ionization rate of 99.2%.

Moreover, the above photoelectric conversion semiconductor exhibits optical absorption coefficients higher than $3.5 \times 10^5$, $8.5 \times 10^4$ and $1.5 \times 10^4$ cm$^{-1}$ for lights with 0.4, 0.5 and 0.6 μm wavelengths, respectively. One of the samples experimentally produced exhibited optical absorption coefficients of $4 \times 10^5$, $1.5 \times 10^5$ and $3 \times 10^4$ cm$^{-1}$ for the lights of the abovesaid wavelengths, respectively.

Figure 1:
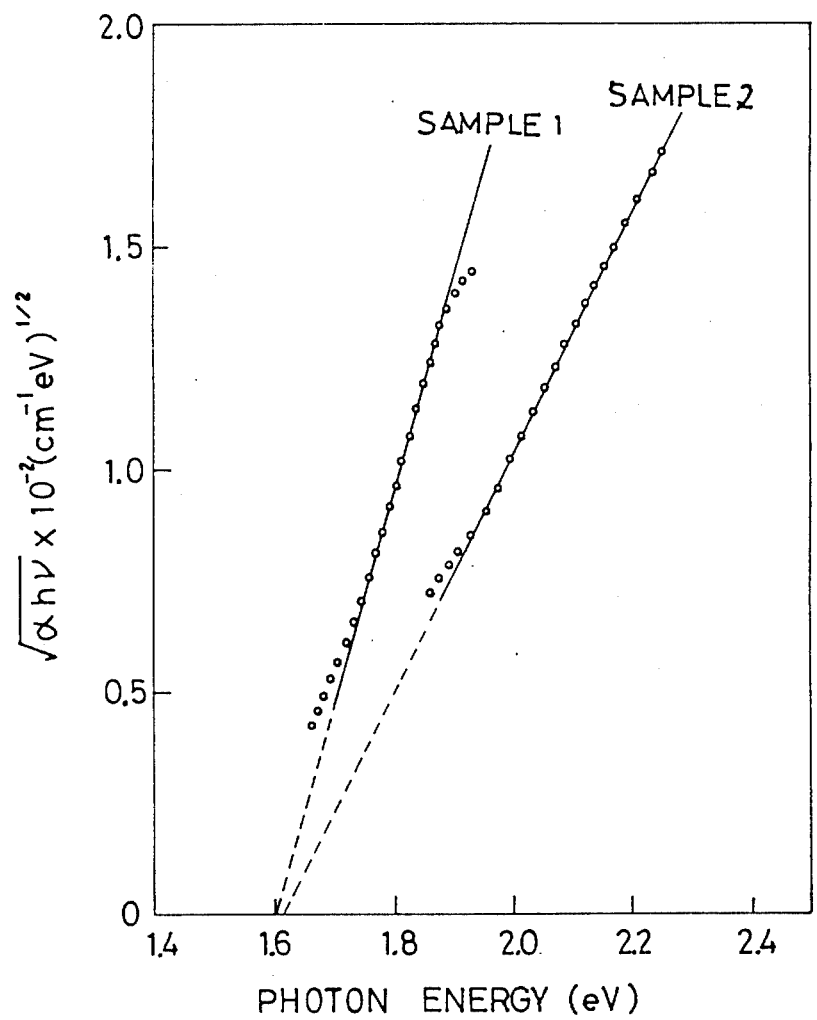
FIG. 1 is a graph showing the optical absorption edge of the photoelectric conversion semiconductors, the abscissa representing photon energy hν and the ordinate $\sqrt{\alpha h \nu}$.

Besides, the above photoelectric conversion semiconductor has an energy band gap in the range of 1.4 to 1.7 eV. In one of the abovesaid samples, the energy band gap was 1.6 eV. This energy band gap 1.6 eV was confirmed by an optical absorption edge which was obtained by plotting the relation between photon energy $h\nu$ (eV) (h being the Planck's constant and $\nu$ a wavelength of light) on the abscissa and $\sqrt{\alpha h \nu}$ ($\alpha$ being an optical absorption coefficient) on the ordinate, as shown in FIG. 1.

In the above photoelectric conversion semiconductor, the transition of electrons is a direct one at low temperatures.

According to the above embodiment of the photoelectric conversion semiconductor of the present invention, the dark-conductivity and the photoconductivity are higher than those of the photoelectric conversion semiconductor formed of non-crystalline silicon, in particular, amorphous silicon, as is the case with the photoelectric conversion semiconductor formed of single crystal silicon. The diffusion length of minority carriers is larger than that of the photoelectric conversion semiconductor formed of the amorphous silicon, as is the case with the photoelectric conversion semiconductor of single crystal silicon. Further, the impurity ionization rate is higher than that of the photoelectric conversion semiconductor formed of the amorphous silicon, as in the case of the photoelectric conversion semiconductor formed of the single crystal silicon. The optical absorption coefficient is larger than that of the photoelectric conversion semiconductor formed of the single crystal silicon, as in the case of the photoelectric conversion semiconductor formed of the amorphous silicon. The energy band gap has a value intermediate between the energy band gaps of the photoelectric conversion semiconductor formed of the single crystal silicon and the photoelectric conversion semiconductor formed of the amorphous silicon.

The above means that the photoelectric conversion semiconductor of the present invention has the excellent properties of both the photoelectric conversion semiconductor formed of the single crystal silicon and the photoelectric conversion semiconductor formed of the amorphous silicon.

The reason for which such excellent properties are provided is that the photoelectric conversion semiconductor of the present invention has a mechanism different from those of the photoelectric conversion semiconductors formed of the single crystal silicon and the amorphous silicon doped with the dangling bond neutralizer. This has been confirmed by an electron rays diffraction photograph. In the electron rays diffraction photograph, a spot pattern produced in the case of only the single crystal silicon, a ring pattern produced in the case of only the polycrystalline silicon and halos produced in the case of only the amorphous silicon were seen.

The fact that the photoelectric conversion semiconductor according to the above embodiment of the present invention has a structure different from that of the photoelectric conversion semiconductor formed of the amorphous silicon and doped with the dangling bond neutralizer can be understood from the fact that the although containing the neutralizer in an amount of only less than 5 mol %, the former greatly excels the latter in the photoconductivity, the dark-conductivity and the diffusion length of minority carriers. By the way, the photoelectric conversion semiconductor of amorphous silicon doped with the dangling bond neutralizer requires doping of the neutralizer in an amount of at least 20 to 30 mol % with regard to the amorphous silicon. The reason for which the amount of dangling bond neutralizer doped in the present invention is smaller than in the case of the abovesaid amorphous silicon is that dangling bonds in the non-crystalline semiconductor are neutralized by the microcrystalline semiconductor.

Figure 2:
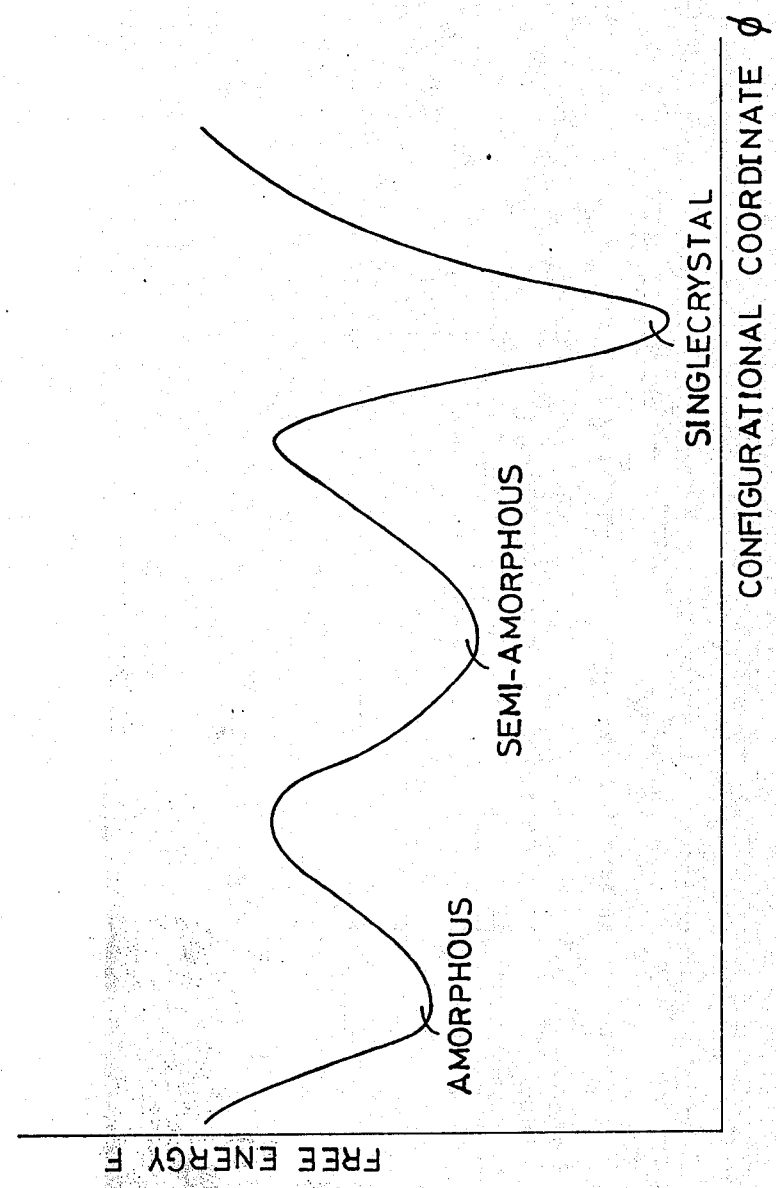
FIG. 2 is a graph showing that the photoelectric conversion semiconductor of the present invention assumes a stable state as is the case with the single crystal, photoelectric conversion semiconductor and the amorphous one, the abscissa representing the configurational coordinate $\phi$ and the ordinate free energy F.

Further, the reason for which the photoelectric conversion semiconductor of the present invention has the aforementioned excellent properties as the photoelectric conversion semiconductor is that the photoelectric conversion semiconductor of the present invention takes stable states as is the case with the single crystal photoelectric conversion semiconductor and the photoelectric conversion semiconductor formed of the amorphous semiconductor, as shown in FIG. 2 which shows the relationship between the configurational coordinate $\phi$ on the abscissa and the free energy F on the ordinate.

As will be evident from the above, the photoelectric conversion semiconductor of the present invention is excellent in the photoconductivity, the diffusion length of minority carriers, the impurity ionization rate and the optical absorption coefficient, and hence it is suitable for use as a light-receiving photoelectric conversion semiconductor. Especially, in the case where the mixture is formed of silicon as in the aforesaid embodiment, since the energy band gap is 1.6 eV, the photoelectric conversion semiconductor is of particular utility as a photoelectric conversion semiconductor for receiving the sunlight. Further, the photoelectric conversion semiconductor of the present invention has a high photoconductivity and a large optical absorption coefficient, so that even if a photo detector is formed in thin layer, an excellent photoelectric function can be obtained. This means that a photo detector with an excellent photoelectric conversion function can be formed by a small amount of material.

Moreover, the photoelectric conversion semiconductor of the present invention permits direct transition of electrons at low temperatures and, further, has high dark-conductivity and impurity ionization rate; hence it is suitable for use as a light-emitting, photoelectric conversion semiconductor.

While in the foregoing the microcrystalline semiconductor and the non-crystalline semiconductor forming the mixture and each silicon, the aforementioned excellent properties can equally be obtained in the cases where the both semiconductors are each germanium, a silicon and additional semiconductor material compound expressed by $Si_3N_{4-x}(0<x<4)$, $SiO_{2-x}$ $(0<x<2)$, $SiC_x(0<x<1)$ or $Si_xGe_{1-x}$ $(0<x<1)$ and the III-V Group compound semiconductor such as GaAs, PB, InP or the like.

next, a description will be given of an embodiment of the method for the manufacture of the photoelectric conversion semiconductor of the present invention which has the aforesaid excellent properties.

Figure 3:
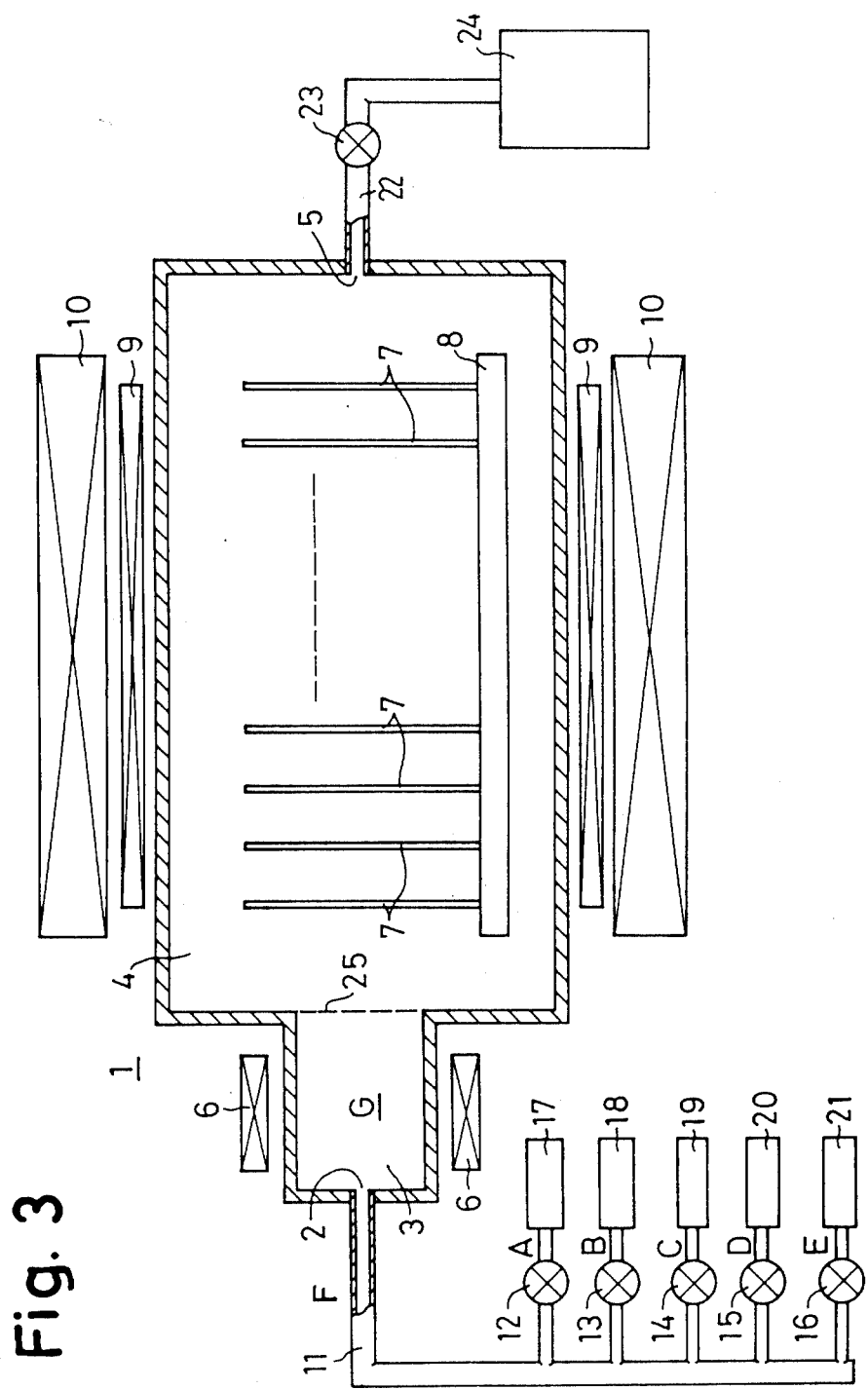
FIG. 3 is a schematic diagram showing an embodiment of the photoelectric conversion semiconductor manufacturing method of the present invention and an example of the arrangement therefor.

FIG. 3 illustrates an embodiment of the photoelectric conversion semiconductor manufacturing method of the present invention and an arrangement therefor, in which a reaction chamber 1 is employed.

The reaction chamber 1 has a gas inlet 2, a gas ionizing region 3, semiconductor depositing region 4, and a gas outlet 5 which are provided in this order. The gas ionizing region 3 has a smaller effective cross-section than the semiconductor depositing region 4. Arranged around the gas ionizing region 3 is an ionizing high-frequency power source 6 which applies to the gas ionizing region 3 an ionizing high-frequency electromagnetic field of, for example, as 1 to 10 GHz, preferably 2,46 GHz. The high-frequency power source 6 may be formed by a coil which is supplied with a high-frequency current.

Disposed around the semiconductor depositing region 4 of the reaction chamber 1 is an orientating-accelerating high-frequency power source 9 which applies to the semiconductor depositing region 4 an orientating-accelerating electric field perpendicularly to the surfaces of the substrates 7. The electric field has a relatively low alternating frequency, for example, 1 to 100 MHz, preferably 13.6 MHz. The high-frequency power source 9 may be formed by a coil which is supplied with a high-frequency current. The high-frequency power source 9 is covered with a heating source 10 which heats the semiconductor depositing region 4 and consequently the substrates 7. The heating source 10 may be a heater which is supplied with a direct current.

To the gas inlet 2 of the reaction chamber 1 is connected one end of a gas mixture supply pipe 11, to which are connected a main semiconductor material compound gas source 17, an N type impurity compound gas source 18, a P type impurity compound gas source 19, an additional semiconductor material compound gas source 20 and a carrier gas source through control valves 12, 13, 14, 15, and 16, respectively. From the main semiconductor material compound gas source 17 is supplied a main-semiconductor material compound gas A such as a main semiconductor material hydride gas, a main semiconductor material halide gas, a main semiconductor material organic compound gas or the like. The main semiconductor material gas A is, for example, a silane ($SiH_4$) gas, a dichlorosilane ($SiH_2Cl_2$) gas, a trichlorosilane ($SiHCl_3$) gas, silicon tetrachloride ($SiCl_4$) gas, a silicon tetrafluoride ($SiF_4$) gas or the like. From the N type impurity compound gas source 18 is supplied an N type impurity compound gas B such as an N type impurity hydride gas, an N type impurity halide gas, N type impurity hydroxide gas or the like, for example, a hydride, halide or hydroxide gas of nitrogen, phosphorus, arsenic, antimony, tellurium, selenium or the like. The N type impurity compound gas B is, for example, a phosphine ($PH_3$) gas, an arsine ($AsH_3$) gas or the like. From the P type impurity compound gas source 19 is supplied a P type impurity compound gas C such as a P type impurity hydride gas, a P type impurity hydroxide gas, a P type impurity halide gas or the like. The P type impurity compound gas C is, for example, a hydride, hydroxide or halide gas of boron, aluminum, gallium, indium, selenium or the like. For instance, a diborane ($B_2H_6$) gas is supplied from the P type impurity compound gas source 19. From the additional semiconductor material compound gas source 20 is supplied an additional semiconductor material compound gas D such as an additional semiconductor material hydroxide or halide gas of nitrogen, germanium, carbon, tin lead or the like, for example, an $SnCl_2$, $SnCl_4$, $Sn(OH)_2$, $Sn(OH)_4$, $GeCl_4$, $CCl_4$, $NCl_3$, $PbCl_2$, $PbCl_4$, $PB(OH)_2$, $Pb(OH)_4$ or the like gas. From the carrier gas source 21 is supplied a carrier gas E which is a gas composed of or contains helium (He) and/or neon (Ne), for example, a gas composed of helium, neon, or mixer gas of helium or neon and hydrogen.

To the gas outlet 5 of the reaction chamber 1 is connected one end of a gas outlet pipe 22, which is connected at the other end to an exhauster 24 through a control valve 23. The exhaust 24 may be a vacuum pump which evacuates the gas in the reaction chamber 1 through the control valve 23 and the gas outlet tube 22.

It is preferred that a gas homogenizer 25 is provided midway between the gas ionizing region 3 and the semiconductor depositing region 4 in the reaction chamber 1.

In the semiconductor depositing region 4 of the reaction chamber 1 there are placed a plurality of parallel substrates 7 planted on a boat 8 as of quartz.

The substrates 7 may be conductive metal substrates as of stainless steel, titanium, titanium nitride or the like, semiconductor substrates as of silicon, silicon oxide, germanium or the like, insulating substrates as of alumina, glass, epoxy resin, polyimido resin or the like, substrates, each having a tin oxide, indium oxide, titanium oxide or like light-transparent, conductive oxide layer formed on an insulating base plate, substrates, each having a conductive metal layer formed on an insulating base plate, or substrates, each having an N or P type semiconductor layer in a single or multi-layer form on an insulating base plate.

As described above, the substrates 7 are placed in the smeiconductor depositing region 4 of the reaction chamber 1 and, in the state in which the gas in the reaction chamber 1 is exhausted by the exhauster 24 through the gas outlet 5, the gas outlet pipe 22 and the control valve 23, a gas mixture F containing at least the main semiconductor material compound gas A available from the main semiconductor material compound gas source 17 via the control valve 12 and the carrier gas F available from the carrier gas source 21 via the control valve 16 is introduced into the gas ionizing region of the reaction chamber 1 via the gas inlet 2. In this case, the gas mixture F may contain the N type impurity compound gas B available from the N type impurity compound gas source 18 via the control valve 13 or the P type impurity compound gas C available from the P type impurity compound gas source 19 via the control valve 14. Further, the gas mixture F may also contain the additional semiconductor material compound gas available from the additional semiconductor material compound gas source 20 via the control valve 5. The amount of the carrier gas E contained in the gas mixture F may be 5 to 99 flow rate %, in particular, 40 to 90 flow rate % relative to the F.

A high-frequency electromagnetic field is applied by the ionizing, high-frequency power source 6 to the gas mixture F introduced into the gas ionizing region 3, by which the gas mixture F is ionized into a plasma, thus forming a gas mixture plasma G in the gas ionizing region 3. In this case, the high-frequency electromagnetic field may be one that has a 10 to 300 W high-frequency energy having a frequency of 1 to 100 GHz, for example, 2.46 GHz.

Since the electromagnetic field employed for ionizing the gas mixture F into the gas mixture plasma G in the gas ionizing region 3 is a micro-wave electromagnetic field and has such a high frequency as mentioned above, the ratio of ionizing the gas mixture F into the gas mixture plasma G is high. The plasma G contain at least a carrier gas plasma into which the carrier gas contained in the gas mixture F is ionized and a main semiconductor material compound gas plasma into which the semiconductor compound gas is ionized. Since the carrier gas contained in the gas mixture F is a gas composed of or containing the helium and/or the neon, it has a high ionizing energy. For example, the helium has an ionizing energy of 24.57 eV and the neon an ionizing energy of 21.59 eV. In contrast thereto, hydrogen and argon employed as the carrier gas in the conventional method have an ionizing energy of only 10 to 15 ev. Consequently, the carrier gas plasma contained in the gas mixture plasma has a large energy. Therefore, the carrier gas plasma promoted the ionization of the semiconductor material compound gas contained in the gas mixture F. Accordingly, the ratio of ionizing the semiconductor material compound gas contained in the gas mixture into the semiconductor material compound gas plasma is high.

Consequently, the flow rate of the semiconductor material compound gas plasma contained in the gas mixture plasma G formed in the gas ionizing region 3 is high relative to the flow rate of the entire gas in the gas ionizing region 3.

The same is true of the case where the additional semiconductor material compound gas D, the N type impurity compound gas B or P type impurity compound gas C is contained in the gas mixture F and ionized into its gas plasma.

The gas mixture plasma G thus formed is flowed into the semiconductor depositing region 4 through the gas homogenizer 25 by exhausting the gas in the reaction chamber 1 by means of the exhauster 24 through the gas outlet 5, the gas outlet pipe 22 and the control valve 23.

By flowing the gas mixture plasma G into the semiconductor depositing region 4, semiconductor material is deposited on the substrates 7 placed in the semiconductor depositing region 4. In this case, the flow rate of the gas mixture F introduced into the reaction chamber 1, especially the flow rate of the carrier gas E contained in the gas mixture F is controlled beforehand by the adjustment of the control valve 16 and the flow rate of the gas exhausted from the reaction chamber 1 through the gas outlet 5 is controlled in advance by adjustment of the control valve 23, by which the atmospheric pressure in the reaction chamber 1 is held below 1 atm. Moreover, the substrates 7 are maintained at a relatively low temperature under a temperature at which semiconductor layers deposited on the substrates become crystallized, for example, in the range from the room temperature to 700° C. In the case of maintaining the substrates at room temperature, the heating source 10 need not be used, but in the case of holding the substrate at a temperature higher than the room temperature, the heating source 10 is used to heat the substrates 7. Furthermore, the deposition of the semiconductor material on the substrates 7 is promoted by the orientating-accelerating electric field established by the orientating-accelerating high-frequency source 9 in a direction perpendicular to the surfaces of the substrates 7. As described above, by depositing the semiconductor material on the substrates 7 in the semiconductor depositing region 4 in the state in which the atmospheric pressure in the reaction chamber 1 is held low and the substrates 7 are held at a relatively low temperature, desired photoelectric conversion semiconductor which is formed of a mixture of a microcrystalline semiconductor and a noncrystalline semiconductor and in which the mixture is doped with a dangling bond neutralizer, as mentioned previously, are formed on each substrates 7.

In this case, the gas mixture plasma in the semiconductor depositing region 4 is the mixture plasma having flowed thereinto from the gas ionizing region 3, and hence is substantially homogeneous in the semiconductor depositing region 4. Consequently, the gas mixture plasma is substantially homogeneous over the entire surface of each substrate 7.

Accordingly, it is possible to obtain on each substrate 7 a photoelectric conversion semiconductor which is homogeneous in the direction of its surface and has substantially no or a negligibly small number of voids. Moreover, even if photoelectric conversion semiconductors are individually formed on a number of substrates 7 concurrently as shown, the photoelectric conversion semiconductors can be made without dispersion in their property; accordingly, the photoelectric conversion semiconductors of good quality can be mass produced.

In addition, since the flow rate of the semiconductor material compound gas plasma contained in the gas mixture plasma G formed in the gas ionizing region 3 is large with respect to the flow rate of the entire gas in the gas ionizing region 3, as mentioned previously, the flow rate of the semiconductor material compound gas plasma contained in the gas mixture on the surface of each substrate 7 in the semiconductor depositing region 4 is also large relative to the flow rate of the entire gas on the surface of the substrate 7. This ensures that the photoelectric conversion semiconductor deposited on the surface of the substrate 7 has substantially no or a negligibly small number of voids and is homogeneous in the direction of the surface of the substrate 7.

Besides, since the carrier gas plasma contained in the gas mixture plasma formed in the gas ionizing region 3 has a large ionizing energy, as referred to previously, the energy of the carrier gas plasma has a large value when and after the gas mixture plasma flows into the semiconductor depositing region 4, and consequently the energy of the semiconductor material compound gas plasma contained in the mixture plasma on the substrate 7 in the semiconductor depositing region 4 has a large value. Accordingly, the photoelectric conversion semiconductor can be deposited on the substrate 7 with high density.

Furthermore, the carrier gas plasma contained in the gas mixture plasma is composed of or includes the helium plasma and/or the neon plasma, and hence has a high thermal conductivity. Incidentally, the helium plasma has a thermal conductivity of 0.123 Kcal/mHg° C. and the neon plasma 0.0398 Kcal/mHg° C. Accordingly, the carrier gas plasma greatly contributes to the provision of a uniform temperature distribution over the entire surface of the substrate 7. As consequence, the photoelectric conversion semiconductor deposited on the substrate 7 can be made homogeneous in the direction of its surface.

Moreover, since the carrier gas plasma contained in the gas mixture in the semiconductor depositing region 4 is a gas plasma composed of or containing the helium plasma and/or the neon plasma, the helium plasma is free to move in the photoelectric conversion semiconductor formed on the substrate 7. This reduces the density of recombination centers which tends to be formed in the photoelectric conversion semiconductor, ensuring to enhance its property.

In accordance with the above embodiment of the present invention, it is possible to form on the substrate 7 a photoelectric conversion semiconductor which has substantially no voids or, if any, a negligibly small number of voids and is homogeneous in the direction of its surface. That is, for example, a photoelectric conversion silicon can be formed on the substrate; further, an N type, photoelectric conversion silicon can also be formed which contains an N type, impurity as of nitrogen, phosphorus, arsenic, antimony, tellurium or selenium may also be formed; moreover, a P type, photoelectric conversion silicon can also be formed which contains a P type impurity as of boron, aluminum, gallium, indium or selenium; furthermore, a photoelectric conversion compound semiconductor can also be formed which is composed of, for example, silicon and nitrogen, germanium, carbon, tin or lead; in addition, a photoelectric conversion compound semiconductor can also be formed which is expressed by, for example, $Si_3N_{4-x}$ ($0<x<1$), $Si_xGe_{1-x}$ ($0<x<1$), $SiC_x$ ($0<x<1$) or $SiO_{2-x}$ ($0<x<2$); besides, an N or P type, photoelectric conversion compound semiconductor can also be formed in which the abovesaid photoelectric conversion compound semiconductor contains the abovesaid N or P type impurity. It is also possible to form a photoelectric conversion compound semiconductor whose composition ratio continuously varies in its thickwise direction. Furthermore, it is also possible to form a photoelectric conversion semiconductor whose composition ratio continuously varies from the composition ratio of a silicon to that of a photoelectric conversion compound semiconductor. Also it is possible to form a photoelectric conversion semiconductor which has formed therein one or more PN or hetero junctions.

According to the method of the present invention described above, the photoelectric conversion semiconductor is formed in the presence of the helium plasma and/or the neon plasma, and hence is annealed. If necessary, however, the photoelectric conversion semiconductor thus annealed may also be further annealed, using the helium plasma and/or neon plasma alone.

It will be apparent that many modifications and variations may be affected without departing from the scope of the novel concepts of this invention.

What is claimed is:

1. A photoelectric conversion semiconductor manufacturing method which employs a reaction chamber provided with a gas inlet, a gas ionizing region, a semiconductor depositing region and a gas outlet arranged in the foregoing order; comprising the steps of disposing a substrate in the semiconductor depositing region of the reaction chamber, and introducing a gas mixture containing at least a semiconductor material gas which includes a dangling bond neutralizer and a carrier gas containing helium and/or neon into the gas ionizing region of the reaction chamber through the gas inlet thereof;

applying, in the gas ionizing region of the reaction chamber, an ionizing, high-frequency electromagnetic field to the gas mixture to ionize it into a gas mixture plasma;

passing the gas mixture plasma into the semiconductor depositing region of the reaction chamber;

depositing the semiconductor material on the substrate from the gas mixture plasma passed into the semiconductor depositing region where the atmospheric pressure in the reactioan chamber is held below 1 atm and the temperature of the substrate is maintained lower than the crystallizing temperature of the deposited semiconductor material to thereby form a photoelectric conversion semiconductor which comprises a mixture of a microcrystalline semiconductor material and a non-crystalline semiconductor material and which is doped with the dangling bond neutralizer; and exhausting the unused gas through the gas outlet.

2. A photoelectric conversion semiconductor manufacturing method according to claim 1, wherein the temperature of the substrate is maintained at 700° C. or lower.

3. A photoelectric conversion semiconductor manufacturing method according to claim 1, wherein the gas mixture contains an impurity imparting N type conductivity to the photoelectric conversion semiconductor to thereby form the photoelectric conversion semiconductor as an N type, photoelectric conversion semiconductor.

4. A photoelectric conversion semiconductor manufacturing method according to claim 1, wherein the gas mixture contains an impurity imparting a P type conductivity to the photoelectric conversion semiconductor to thereby form the photoelectric conversion semiconductor as a P type, photoelectric conversion semiconductor.

5. A photoelectric conversion semiconductor manufacturing method according to claim 1, wherein the semiconductor material gas contained in the gas mixture consists principally of a silicon compound gas to thereby form the photoelectric conversion semiconductor as a photoelectric conversion semiconductor consisting principally of silicon.

6. A photoelectric conversion semiconductor manufacturing method which employs a reaction chamber provided with a gas inlet, a gas ionizing region, a semiconductor depositing region and a gas outlet arranged in the foregoing order; comprising the steps of
disposing a substrate in the semiconductor depositing region of the reaction chamber, and intruducing a gas mixture containing at least a semiconductor material gas which includes a dangling bond neutralizer and a carrier gas containing helium and/or neon into the gas ionizing region of the reaction chamber through the gas inlet thereof;
applying, in the gas ionizing region of the reaction chamber, an ionizing, high-frequency electromagnetic field to the gas mixture to ionize it into a gas mixture plasma;
passing the gas mixture plasma into the semiconductor depositing region of the reaction chamber;
depositing the semiconductor material on the substrate from the gas mixture plasma passed into the semiconductor depositing region where the atmospheric pressure in the reaction chamber is held below 1 atm and the temperature of the substrate is maintained lower than the crystallizing temperature of the deposited semiconductor material to thereby form a photoelectric conversion semiconductor which comprises a mixture of a microcrystalline semiconductor material having a lattice strain and a non-crystalline semiconductor material and which is doped with the dangling bond neutralizer; and
exhausting the unused gas through the gas outlet.

7. A photoelectric conversion semiconductor manufacturing method which employs a reaction chamber provided with a gas inlet, a gas ionizing region, a semiconductor depositing region and a gas outlet arranged in the foregoing order; comprising the steps of
disposing a substrate in the semiconductor depositing region of the reaction chamber, and introducing a gas mixture containing at least a semiconductor material gas which includes a dangling bond neutralizer into the gas ionizing region of the reaction chamber through the gas inlet thereof;
applying, in the gas ionizing region of the reaction chamber, an ionizing, high-frequency electromagnetic field to the gas mixture to ionize it into a gas mixture plasma;
passing the gas mixture plasma into the semiconductor depositing region of the reaction chamber;
depositing the semiconductor material on the substrate from the gas mixture plasma passed into the semiconductor depositing region where the atmospheric pressure in the reaction chamber is held below 1 atm and the temperature of the substrate is maintained lower than the crystallizing temperature of the deposited semiconductor material to thereby form a photoelectric conversion semiconductor which comprises a mixture of a microcrystalline semiconductor material and a non-crystalline semiconductor material and which is doped with the dangling bond neutralizer; and
exhausting the unused gas through the gas outlet.

8. A photoelectric conversion semiconductor manufacturing method as in claim 7 where said microcrystalline semiconductor material has a lattice strain.

* * * * *